(12) United States Patent
Lindquist et al.

(10) Patent No.: US 11,435,390 B1
(45) Date of Patent: Sep. 6, 2022

(54) ION-DENSITY DETECTION SYSTEM FOR AN AERIAL DEVICE

(71) Applicant: Altec Industries, Inc., Birmingham, AL (US)

(72) Inventors: David Lindquist, Cameron, MO (US); William Naber, Saint Joseph, MO (US)

(73) Assignee: Altec Industries, Inc., Birmingham, AL (US)

(*) Notice: Subject to any disclaimer, the term of this patent is extended or adjusted under 35 U.S.C. 154(b) by 0 days.

(21) Appl. No.: 17/560,588

(22) Filed: Dec. 23, 2021

(51) Int. Cl.
*G01R 31/00* (2006.01)
*G01R 31/12* (2020.01)

(52) U.S. Cl.
CPC ..... *G01R 31/1218* (2013.01); *G01R 31/1245* (2013.01)

(58) Field of Classification Search
CPC ............ G01R 31/1218; G01R 31/1245; G01R 19/08; G01R 19/12; G01R 19/155; G01R 1/06777; G01R 1/02; G01R 27/025; G01R 29/12; G01R 29/085; G01R 29/24; G01R 29/0023; G01R 25/005
See application file for complete search history.

(56) References Cited

U.S. PATENT DOCUMENTS

| | | | |
|---|---|---|---|
| 4,114,088 A | 9/1978 | Laws | |
| 4,877,422 A | 10/1989 | Walbridge et al. | |
| 6,853,196 B1* | 2/2005 | Barnum | G01R 31/11 324/543 |
| 10,067,170 B2* | 9/2018 | Olson | G01V 3/15 |
| 10,338,107 B1* | 7/2019 | Beck | B66F 17/006 |
| 2016/0356826 A1* | 12/2016 | Ball | G01R 31/1245 |
| 2019/0135603 A1* | 5/2019 | Bilic | H02G 1/02 |

* cited by examiner

*Primary Examiner* — Thang X Le
(74) *Attorney, Agent, or Firm* — Erise IP, P.A.

(57) ABSTRACT

A dielectric alert system and method for an aerial device including a boom having both insulative and conductive members is disclosed. Specifically, an ion-density detection system measures the potential for a dielectric breakdown in the environment of an insulative aerial system. The ion-density detection device can be a UV sensor or a UV camera. If data is received indicating the possibility of dielectric breakdown of the insulative portion, warnings are issued to an operator, crew, or any other interested party.

20 Claims, 6 Drawing Sheets

ION-DENSITY DETECTION SYSTEM FOR AN AERIAL DEVICE

BACKGROUND

1. Field

Embodiments of the invention relate to alert systems for dielectric conditions in an aerial device. More specifically, embodiments of the invention relate to the use of ion-density detection systems to measure the potential for a dielectric breakdown in an aerial system.

2. Related Art

Aerial devices are commonly used to perform tasks at heights not typically or reasonably reached by other means. For example, aerial devices can be used to hoist workers up to perform tasks such as trimming trees, building construction, roofing, sign maintenance, electrical line maintenance and erection, etc. At times, these aerial devices may need to work in inclement weather.

A typical aerial device is largely made of conductive materials. But portions of the boom on an aerial system are often constructed of low-conductivity materials, e.g., fiberglass, so that if the boom contacts a power line or other source of high voltage, electricity will be prevented from traveling through the aerial device to the ground. To prevent this, a dielectric gap has been formed across the boom of some aerial devices by incorporating nonconductive materials into portions of the system.

The ionic conditions in which operators of insulating aerial devices operate can change suddenly and break down the dielectric integrity of the atmosphere around an insulating portion of an aerial device. A common source of reduction of atmospheric dielectric integrity is dust, which can exist at all kinds of work sites, and be transmitted in the air by wind, disruptive equipment, electrical fields, and other things. The maintenance of the dielectric integrity in the environment surrounding an insulative portion of the boom is critical in avoiding injury to workers and damage to equipment while working on high voltage power lines or other high electrical energy sources.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

In some aspects, the techniques described herein relate to an aerial device, including: a base; a boom operatively attached to the base and configured to extend upward and support a platform in a plurality of positions; a conductive portion of the boom; an insulative portion of the boom; an ion-density detection device on the aerial device, the ion-density detection device being positioned to measure ion density at a location on the insulative portion of the boom; and a computing system operatively connected to the ion-density detection device, the computing system configured to receive data from the ion-density detection device and transmit an alert to an operator of the aerial device of a detected ion-density level indicative of a breakdown in dielectric integrity of the insulative portion of the boom.

In some aspects, the techniques described herein relate to an aerial device wherein the ion-density detection device is a UV sensor.

In some aspects, the techniques described herein relate to an aerial device wherein the ion-density detection device is a UV camera.

In some aspects, the techniques described herein relate to an aerial device wherein the computing system is configured to couple the alert with a display enabling a viewing by the operator of the location on the insulative portion of the boom.

In some aspects, the techniques described herein relate to an aerial device wherein the location on the insulative portion of the boom where the ion-density detection device is positioned to measure includes a metal conductor configured to draw ions.

In some aspects, the techniques described herein relate to an aerial device wherein the metal conductor is formed as an annular ring around a periphery of the insulative portion.

In some aspects, the techniques described herein relate to an aerial device including: an upper boom defining both the conductive portion and the insulative portion, the ion-density detection device being mounted onto the conductive portion and being aimed toward a distal end of the insulative portion.

In some aspects, the techniques described herein relate to an aerial device wherein the computing system includes: a processor; a database component operatively connected to the processor; and an alert device, the alert device being configured to transmit the alert using one of: an audio indication, a warning light, or a display.

In some aspects, the techniques described herein relate to an aerial device wherein the processor is configured to determine whether ion-density values are static relative to a baseline, and if not the processor is further configured to indicate to an operator that the ion-density values are not static.

In some aspects, the techniques described herein relate to an aerial device wherein the processor is configured to calculate a percentage of ion density over baseline and then display the percentage to the operator.

In some aspects, the techniques described herein relate to an aerial device wherein the processor is configured to determine whether ion-density values are above a threshold, and if so, transmit the alert.

In some aspects, the techniques described herein relate to an aerial device wherein the processor is configured to: use an ion-density reading to calculate an extent of ion density existing above a baseline, and communicate the extent to an operator; the processor further configured to determine whether the ion-density reading is above a predetermined threshold, and then issue an alert if the ion-density reading is above the predetermined threshold.

In some aspects, the techniques described herein relate to an aerial device wherein the processor determines ion density at the location on the insulative portion of the boom using a blob detection process.

In some aspects, the techniques described herein relate to an aerial device wherein the processor determines ion density at the location on the insulative portion of the boom using a particle analysis process.

In some aspects, the techniques described herein relate to an system for determining a dielectric status of an insulative component on an aerial device, the system including: a computing system operatively connected to a UV camera, the UV camera being directed to view an area on or about the insulative component; the computing system configured to evaluate images from the UV camera and evaluate the images using one of blob detection or particle analysis to determine whether an ion-density condition exists which is indicative of a dielectric breakdown in the insulative component; and the computing system additionally being configured to transmit a warning signal, the warning signal indicating an existence of the ion-density condition of the insulative component.

In some aspects, the techniques described herein relate to a system wherein: a processor in the computing system is configured to calculate a percentage of ion density over a baseline and then display the percentage to the operator.

In some aspects, the techniques described herein relate to a system wherein: a processor is configured to determine whether ion-density values are above a threshold, and if so, transmit the warning signal.

In some aspects, the techniques described herein relate to a system wherein: the processor is further configured to, upon receiving the warning signal, activate one of an audio device, a light, or a display in a manner which conveys an alert indicating a dielectric breakdown to an operator.

In some aspects, the techniques described herein relate to a system wherein: the insulative component is a portion of a boom of an aerial device, and the UV camera is configured to view UV photon emissions from a gradient control device on the insulative component.

In some aspects, the techniques described herein relate to an dielectric component integrity monitoring system including: a processor; a UV detecting device operatively connected to the processor, the UV detecting device being aimed at an area on an insulative component of which ion-density is a concern; a database including one or more non-transitory computer readable storage media and having a computer program stored thereon for alerting one or more users of an aerial device, wherein the computer program instructs the processor to perform actions including: receiving UV photon readings from the UV detecting device; monitoring an ion-density value at the area on the insulative component using the UV detecting device; determining if using the ion-density values indicate a risk of dielectric breakdown in a boom component; and transmitting an alert to a user if the ion-density values are determined to indicate a risk of dielectric breakdown.

BRIEF DESCRIPTION OF THE DRAWING FIGURES

Embodiments of the invention are described in detail below with reference to the attached drawing figures, wherein.

Figure 1:
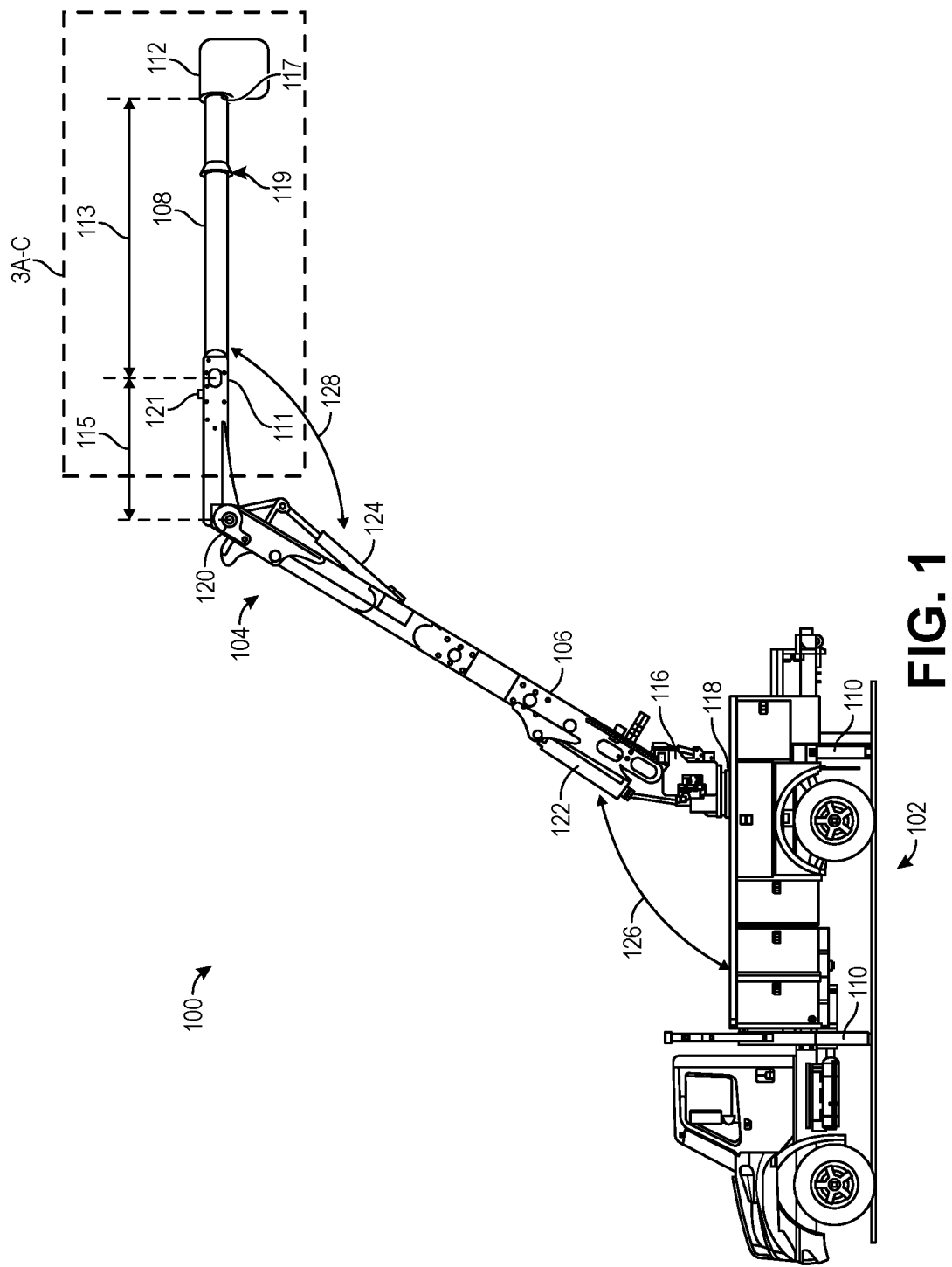
FIG. 1 is a side view of an aerial device into which the systems and methods disclosed herein might be incorporated in some embodiments.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the technology can include a variety of combinations and/or integrations of the embodiments described herein.

FIG. 1 shows a side view of an aerial device 100 into which the environmental dielectric alert system might be incorporated in embodiments. Similar components illustrated in different figures are enumerated with like numerals and may include alternative embodiments.

The aerial device 100 may include some sort of base that supports an extendable member configured for reaching (e.g., a boom 104). In the embodiment depicted in FIG. 1, the base 102 is a utility truck. In some embodiments, the base 102 may be a crane, a derrick digger, or any other base including an extendable member. In some embodiments, the boom 104 provides an extendable member for moving a platform 112. In some embodiments, the boom 104 may include a lower boom 106 and an upper boom 108. The base 102 provides a stable support, which may include outriggers 110, for supporting a load applied to the boom 104 and/or the platform 112. In some embodiments, the platform 112 may rotate to alter its orientation with respect to the boom 104. The boom 104 may fold into a collapsed position, which enables transporting via a mobile version of the base 102.

The boom 104 is mechanically coupled to, and configured to support, the platform 112. The optional platform 112 may be located at the distal end (with respect to the mobile base 102) of the upper boom 108. The upper boom 108 may include an optional telescoping arm (not shown) that extends from, and retracts within, the upper boom 108. The lower boom 106 may be mechanically coupled to a turntable 116 configured for rotating the boom 104. A pedestal 118 may be included to support the turntable 116 and is mechanically coupled to the base 102.

In operation, the platform 112 is raised by a combination of the lower boom 106 pivoting upwards, the upper boom 108 pivoting about an elbow 120, and the telescoping arm optionally extending out of the upper boom 108.

In an embodiment, the platform 112 is configured for hoisting a user into the air to, for example, work on a powerline or any other elevated thing. Prior to extending the boom 104, the base 102 may be moved to an appropriate location and stabilized. The boom 104 may be rotated about the turntable 116, and extended upwards and outwards away from the base 102 by pivoting the lower boom 106, the upper boom 108, and by extending the telescoping arm. Various combinations of these movements may be employed to position the platform 112 around base 102. In some embodiments, movement of the platform 112 may be operated by a user located on the platform 112. In some embodiments, operation of the platform 112 may be controlled by an operator not located on platform 112 (e.g., on the ground). In both cases, the user may not be able to see all aspects of the moving portions of the boom 104 (e.g., turntable 130, lower boom 106, upper boom 108, elbow 120, etc.). Accordingly, certain components may, unbeknownst to the user, come within a dangerous proximity to a voltage or current source (e.g., a powerline, a telecommunications line, etc.). As will be discussed further below, an ion-density measuring alert system may, in some embodiments, be configured to warn a user or operator that there is a risk of a dielectric breakdown.

Specific to these concerns, in certain embodiments, the upper boom 108 and any telescoping arm that may extend from upper boom 108 may be at risk of dangerous electric conduction when work is being done proximate a high voltage source. The upper boom 108, in the disclosed embodiment, includes a conductive metal portion 115 and a nonconductive insulative portion 113, defining a conductive/insulative interface 111 therebetween where the boom transitions from metal (or some other conductive material) to the dielectric or nonconductive material. Any telescoping arm that may extend from the upper boom 108, in embodiments, might also be made of an electrically insulating material defining an insulated portion of the overall aerial device to further insulate between the base 102 and the bucket 112 in the case of a high-voltage exposure.

In some embodiments, a dielectric composite material (e.g., fiberglass) can be utilized to construct the insulative portion 113 as well as any extending apparatus from the upper boom 108. The insulative portion 113 enables safe operation near electrical hazards (e.g., power lines). Such an insulating composition may, in some embodiments, be configured to protect a user within platform 112 or an operator near base 102 from a situation in which a portion of boom 104 comes in contact or close proximity with a portion of a high voltage system. Such an insulating gap may require the use of electrically insulating signaling methods between base 102 and platform 112, such as the use of fiber optic cables instead of conductive circuitry, such as including metal or a direct wired connection. There is a risk of dielectric breakdown due to an increase of negatively charged ions in the environment surrounding insulative portion of the boom. The build up of negatively charged ions can be caused by dust, high electrical fields, etc. and ultimately result in an electron avalanche which under the right conditions can cause electrons to collide with neutral atoms creating more ions. These ions can build to the point of which the insulative boom surface and environment surrounding the insulative portion of the boom becomes saturated and they flashover/jump to the closest conductive component/object. Which can endanger the operator(s), equipment, and infrastructure in the vicinity.

Aerial device 100 may include a first boom hydraulic cylinder 122 and a second boom hydraulic cylinder 124 configured to move certain components of boom 104. For example, first boom hydraulic cylinder 122 may be configured to move lower boom 106 around lower boom joint angle 126. In some embodiments, second boom hydraulic cylinder 124 may be configured to move upper boom 108 around upper boom joint angle 128.

Figure 2:
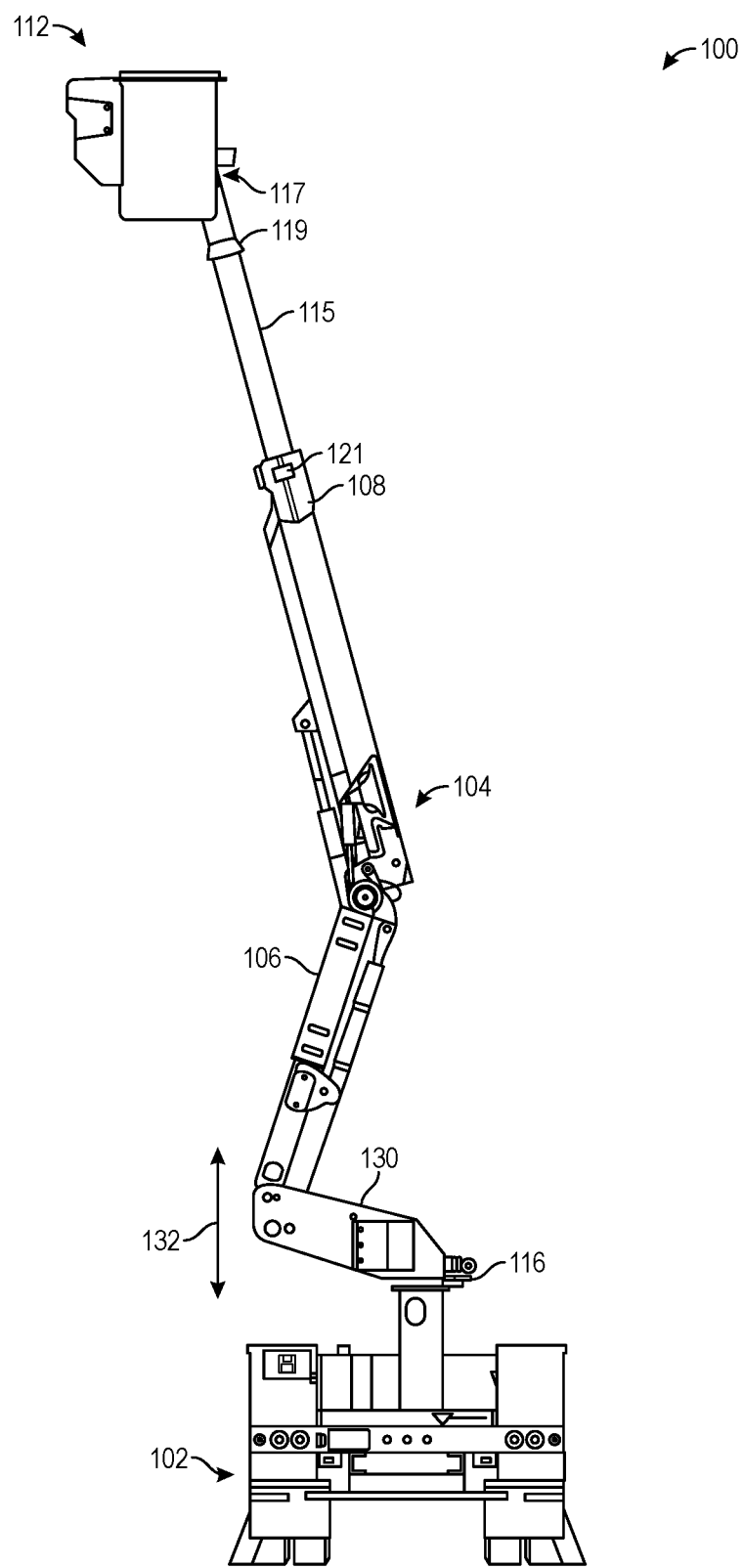
FIG. 2 is a rear view of an aerial device of FIG. 1.

As depicted in FIG. 2, in some embodiments, aerial device 100 may include an turntable 130. In some embodiments, turntable 130 may be disposed between base 102 and lower boom 106. In some embodiments, turntable 130 may be configured to raise or lower boom 106 in a substantially vertical direction (e.g., direction 132).

Boom 104 is rotatable and extendable. For extending its reach, in some embodiments the boom 104 may comprise a multi-segment boom having more than one segment. For example, as depicted in FIGS. 1-2, the boom 104 may include at least lower boom 106 and upper boom 108. The boom segments may be mechanically coupled in a variety of ways to enable various movements including but not limited to extending, contracting, raising, lowering, and rotating. For example, some boom segments may be pivotally coupled with joints for articulating, while other boom segments may be telescoping for extending/contracting. However, as mentioned, the boom 104 may include greater than two segments without departing from the scope hereof, such as turntable 130. Movement of the boom 104 may be by one or more hydraulic cylinders (e.g., first boom hydraulic cylinder 122, second boom hydraulic cylinder 124, etc.) mechanically coupled to segments of the boom 104, among other mechanical devices (e.g., cables).

The base 102 is provided to mechanically support the boom 104. The base 102 may be stationary (e.g., a fixed structure such as a crane or an oilrig) or mobile (e.g., an earth-working machine or a utility truck). In certain embodiments, the lower boom 106 may be mechanically coupled to the base 102, and the upper boom 108 may be mechanically coupled to the lower boom 106 via elbow 120 (see e.g., FIGS. 1-2).

An optional platform 112 may be mechanically coupled to a tip of the boom 104 at its distal end. In some embodiments, the base 102 may be mechanically coupled to a first end of the boom 104 (e.g., the proximal end), and the optional platform 112 may be mechanically coupled to a second end of the boom 104 (e.g., the distal end), opposite the first end. In some embodiments, the platform 112 may be configured to support one or more operators (e.g., in a utility bucket).

Despite the protection offered by insulating a portion of the boom, there is a risk that the dielectric properties of that portion can be reduced by the presence of dust, or other relatively conductive materials encountered in work environments that facilitate the formation of an ionic cloud. The presence of these contaminants can form an undesirable electron path about the exterior insulating boom surfaces should the aerial device encounter a high voltage energy source, such as power lines. Therefore, an alert system is disclosed for the purpose of detecting the presence of ions to provide an additional layer of protection against flashover events.

When any source of high voltage ionizes dust particles UV radiation is immediately (but briefly) discharged. The system and methods disclosed herein take advantage of this by measuring any such UV discharge, and then warning operators of the potentially dangerous situation. This can be done in a variety of ways. For example, ion density sensors exist that enable the detection of any UV resulting from high voltage encountering the dielectric compromising dust (or other substance) on and around the boom. In one embodiment, one or more UV camera(s) are used to capture real time ion density in an atmospheric zone surrounding the insulating portion of the aerial device.

Figure 3:
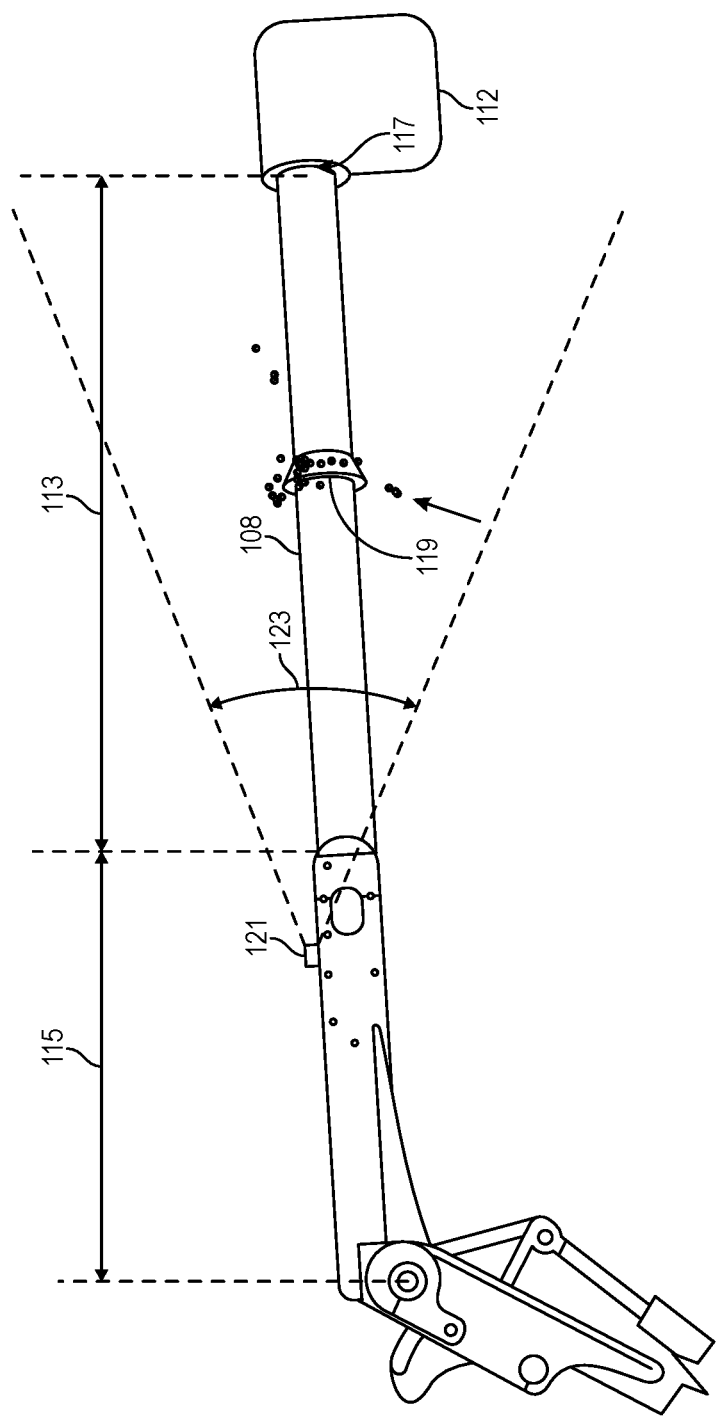
FIG. 3 is a magnified view of the relevant boom sections extracted from FIG. 1 showing details of the system at a nominal level of ion discharge.

FIG. 3 is a magnified view of the relevant boom sections extracted from FIG. 1 so that the details of the ion discharge measurement system can be seen in detail. Referring to the figure, it can be seen that this particular aerial device includes a gradient control device 119, which is an electrically conductive annular ring around the periphery of the insulated section at a distal end 117 of the upper boom 108. In one aspect, gradient control devices distribute and reduce an electrical field gradient around an object (here, the elongated boom structure) and control and reduce corona discharge. Because of that, the ion density existing about the ring 119 is a good indicator of the overall ion density present and creates a focal point for the observation of overall dielectric status in the area of the insulating portion of the boom 113.

Although the embodiment shown in FIG. 3 discloses a gradient control device, the component is not necessary in order for the broad concepts disclosed herein to be applied. It is of course possible that ion-density readings could be taken from alternative devices on the boom, or from the boom dielectric surfaces themselves.

FIG. 3 also illustrates one or more ion-density measurement devices, e.g., ion-measurement device 121. Measurement device 121 can take any form of mechanism configured to sense or visualize ultraviolet (UV) light in a way that can quantify UV photons in terms of magnitude (UV photons are emitted by ions resulting from the contaminants being exposed to electrical power). In one embodiment, the ion-density measurement device is a UV camera. More specifically, a corona camera can be used in embodiments. For example, DayCor® cameras manufactured by Ofil, Ltd. have been used in the power industry to measure power losses existing in overhead lines, and could be used in the systems disclosed. Other known technologies, e.g., UV sensors, etc., could be used instead and still fall within the broad aspects of what is disclosed herein. In addition to ion-density measurement camera 121, other cameras could also be incorporated into the system. For example, additional cameras could be mounted at a plurality of locations around the periphery of the boom at the position of the shown camera 121 in order to receive a more complete view. Further, one or more UV cameras could be mounted near at the platform end (at platform 112) aimed at the gradient control device 119 from the opposite direction to obtain more complete visualization, and thus, readings.

Some UV cameras, in embodiments, include a preset conical range of vision which is sometimes truncated to fit a display screen or alternatively, can simply read UV photon values in order to establish ion density. Here, a cross sectional angle 123 of the conical range of vision can be seen and has been selected to optimize concentration on photons being transmitted from a targeted area, which is the areas immediately around the gradient control device 119 in this embodiment. In yet other embodiments, however, the camera range of vision could be selected to focus on an alternative conductive device (other than the gradient control device) that is relatively conductive compared to the insulative portion 113 of the boom. Additionally, the camera or other sensor could be configured to receive UV photon readings from an exterior location of the insulative portion 113 of the boom itself.

Figure 4:
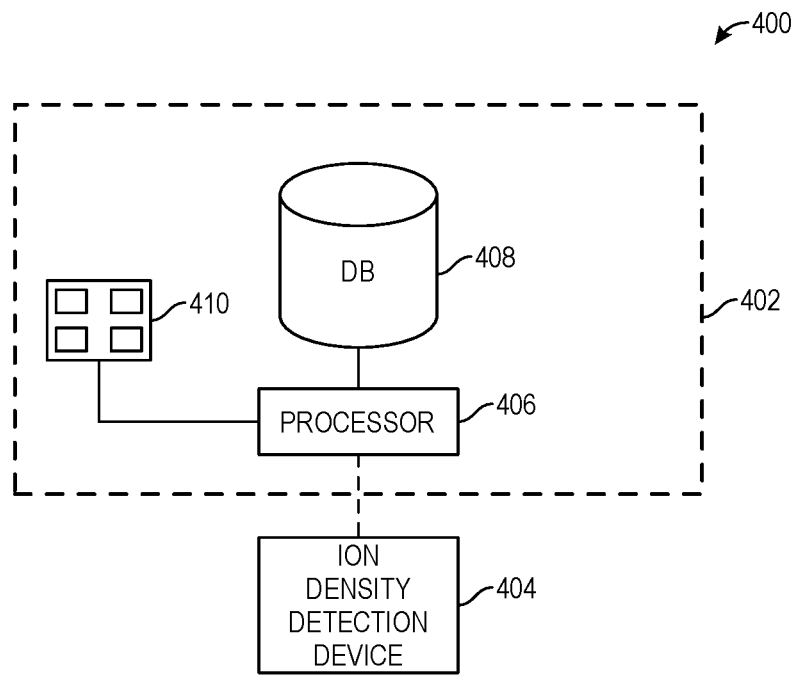
FIG. 4 illustrates a block diagram of an exemplary ion discharge measurement and dielectric alert system, in some embodiments.

FIG. 4 shows a block diagram representing an exemplary dielectric alert system 400 using ion-density measurements. The alert system 400 can, in some embodiments, be utilized on an aerial device, e.g., aerial device 100, and be controlled by a computer system 402. The computer system 402 is configured to receive readings from an ion detection device 404.

In embodiments, the computer system 402 might comprise a computer, microcontroller, microprocessor, or programmable logic controller (PLC). In terms of location, the computer system 402 might be located in a variety of, or multiple locations places on the aerial device 100. In some embodiments, the computer system 402 might include a computer located on (or in) the base 102 of aerial device 100. In some embodiments, the computer system 402 may comprise a computing device disposed on the turntable 116 of aerial device 100. In some embodiments, the computer system 402 may include a computer disposed on the boom 104 of aerial device 100. In some embodiments, the computer system 402 may include a computer disposed on the platform 112 of aerial device 100. In some embodiments, computer system 402 may comprise more than one computing device located in any of the already described or other locations on aerial device 100 or on a mobile device. In these embodiments, the computing devices may be operatively connected for communication therebetween.

In some embodiments, the computer system 402 is functionally centered around at least one processing component 406. The processing component 406 accesses data existing on a database 408 and receives inputs and sends information to a user interface 410. In some embodiments, database 408 includes non-transitory computer readable storage media having computer programs and other data stored thereon.

In some embodiments, the user interface 410 might include physical buttons, levers, a computer keyboard, an interactive touch screen, a hand-held control stick (e.g., a joystick or sidestick controller), or a mobile device. The interface 410 might also comprise numerous interfaces operating together with a common or multiple separate computing devices.

Interface 410 is used to interface with the processing component 406 and cause it to operate using programming existing on the database 408. Interface 410, or an additional optional interface can enable an interested party, e.g., an operator, additional crew personnel (local or remote), ground crews, to acknowledge a warning or alert and take corrective action. In the disclosed embodiment of FIG. 4, the interface is a touch screen display presenting a graphical user interface including control buttons, and image and video capabilities. In some embodiments, the interface 410 is able to receive video (and/or image) content from the ion density detection device 404 where that device is a UV video camera.

The environmental alert system 400 may provide an alert that informs an interested party, e.g., an operator of the aerial device 100, crew personnel (local or remote), ground crews, of a potentially unsafe situation as a result of the increased ion density due to: e.g., that dust or other contaminants exist on and in the surrounding environment of the insulative portion 113 of the upper boom 108 to the extent that the dielectric integrity of the aerial device 100 has been compromised. The system 400 might also include alert devices to produce the alert such as alarms, lights, display devices, speaker systems, buzzers, color-coded illuminations (e.g., flashing yellow/red), or other similar alerting indications. These alert indicators can be located at any location on the aerial device 100, e.g., on the boom, in or on the base, at the bucket, etc.

The computing system 402, in some embodiments, receives information regarding ion density existing near the gradient control device 119 or at some other location on the insulated component surfaces of insulative portion 113 of the upper boom 108.

Figure 5:
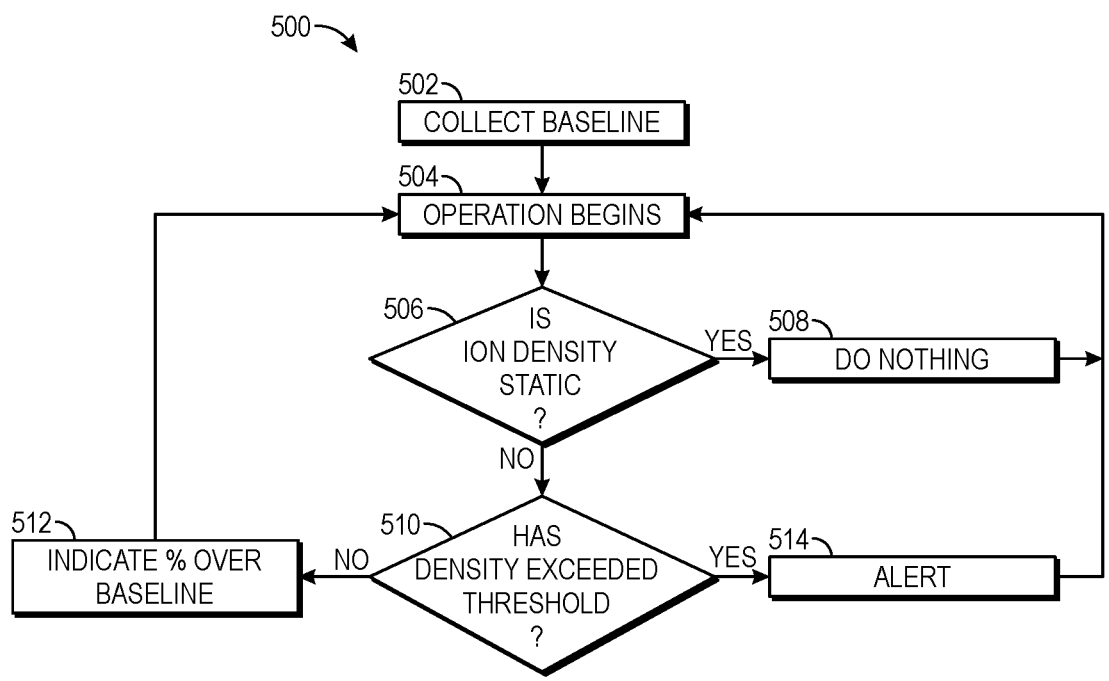
FIG. 5 is a process flow diagram reflecting an embodiment of a process executable along with the system embodiment shown in FIG. 4.

FIG. 5 is a process flow diagram 500 reflecting an embodiment of a process executable along with the system embodiment shown in FIG. 4. In a first step 502 in FIG. 5, a baseline (reference value) is established by using the ion-density detection device 404 to take a reading when it is known that levels are normal (where there is no concentrated ionic activity). For example, the baseline would preferably be taken when there is no contamination on the insulative portion 113, and where there is not any exposure to an external electrical voltage (e.g., the boom of the aerial device has not yet been extended and thus not near any high-voltage overhead power line, etc.). It is possible that the ion density is already high upon the initial reading in step 502, and where this is the case, the process of FIG. 5 could be configured to provide an indication to the interested party. In one embodiment, the baseline could be established when a Power Take-Off (PTO) signal is received. The PTO signal is a detection of power being diverted to boom operation, and thus, is a good time to take baseline readings since the aerial device 100 will already be on location, and the boom 104 will not yet be extended into a space of possible energization. Alternatively, the baseline could be established upon upper controls engagement. In other alternative embodiments, additional secondary baselines could be established using user input based on the interpretation of visual data received from the UV camera. These visually-established secondary baselines could help to eliminate common sources of error, e.g., sunlight, etc.

A next step 504 represents a beginning of the monitoring process. In some embodiments, the ion-density measuring process might also initially begin when a PTO signal is recognized by the computer system 402. This ensures that when the boom 104 is in operation, the process of FIG. 5 is executing. And after subsequent FIG. 5 processes have concluded, the process will return to step 504 for continuation.

Once the monitoring processes have started up, in a next step 506, a determination is made as to whether the level of ion-density is static (not increasing or otherwise fluctuating). The readings of ion-density levels received by the computer system 402 from the ion density detection device 404 will be evaluated by an algorithm running on processor 406 according to instructions existing in database 408. The algorithms on database 408 and running on processor 406 can include a means to filter out erroneous UV sources such as, the sun, corona being discharged from nearby structures, and other UV sources potentially existing at the distal end 117 of the aerial device 100. Thus, if such anomalies exist, they will be removed such that they do not impact the levels detected. In addition to these built in algorithms, supplementary user input/interpretation of ion density source(s) via UV camera video feed, may be utilized to verify the erroneous UV sources outside the area of interest. A need for supplementary input may be instigated by a message from the processor 406 which is displayed on the user interface 410.

In order to quantify a level of ion density, the algorithms can configure the processor 406 to evaluate photon numbers received from the target area (the area of the gradient control device 119) and subtract those that can be attributed to anomalies. Where the ion-density detection device 404 is a UV camera, either blob detection and/or particle analysis can be used to monitor the ion particle activity and density in the surrounding atmosphere directly adjacent to the boom. Regardless of the processes employed by the computer system 402, the readings will provide a good indication of relevant UV levels.

Under normal circumstances, the ion-density levels read from ion-density detection device 404 when evaluated by the computer system 402 will not be appreciably different than they were when the baseline was established.

In some embodiments, a nominal ion-density threshold will be set where a level of difference in the currently obtained reading and the baseline is great enough to raise concern. Alternatively, the threshold could initially be taken from the baseline value, but thereafter be taken by comparing the change in value against past recorded values on the database 408. Regardless, where the nominal ion-density threshold is not met, there is currently no concern of a dielectric breakdown, no action is taken (step 508), and the process returns to start (step 504).

Figure 6A:
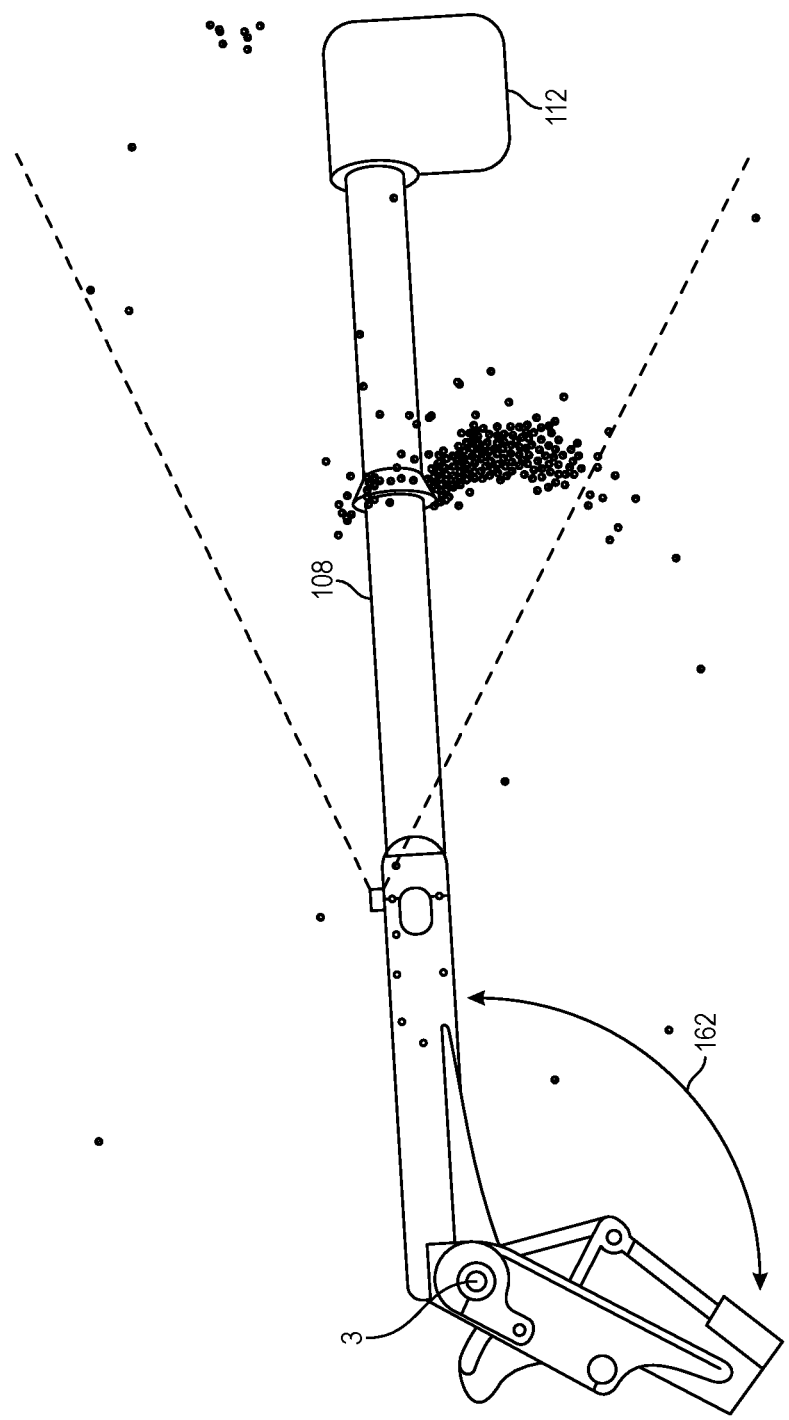
FIG. 6A is a magnified view of the relevant boom sections extracted from FIG. 3 showing details of the system at an intermediate level of ion discharge.
Figure 6B:
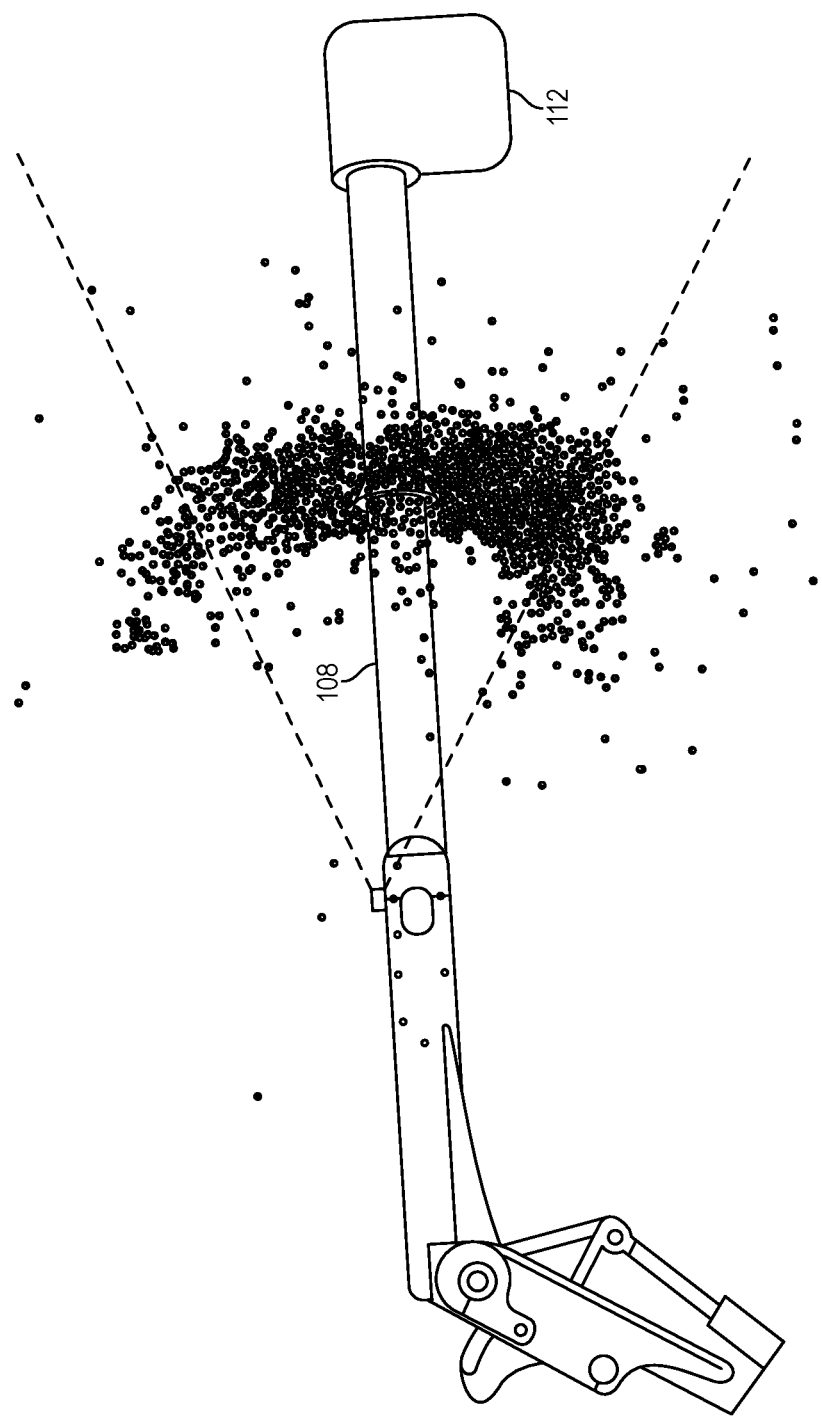
FIG. 6B is a magnified view of the relevant boom sections extracted from FIG. 3 showing details of the system at an elevated alert level of ion discharge.

FIGS. 6A and 6B are each views of how the boom section reflected in FIG. 3 might appear on a display at different levels of ion densification due to dust or some other form of contaminant near or in the surrounding environment of the insulative portion 113. These views are provided to reveal how the processes of FIG. 5 might also be associated with real-time viewing capabilities using live video from the ion-density measurement device 121 (e.g., a UV camera). In some embodiments, the footage can be displayed on the display on the user interface 410, such as a touchscreen monitor, and seen live by the interested party. The video signal could also be received and displayed on hand-held or other computing devices possessed by crew personnel (local or remote), ground crews, or other interested parties. Looking back to FIG. 3, the view of the boom components were shown in an ordinary state of ion discharge in that little, or no ionization is represented as the gradient control device 119 might appear given a "no" answer in step 510 because the nominal threshold has not been exceeded.

If, in step 506, the ion-density algorithm running on the computing system 402 determines that the ion density level has changed appreciably (has either deviated beyond a nominal threshold above baseline or has adequately deviated as compared against past recorded values) the process moves on to a step 510.

In step 510, a determination is made as to whether the ion density level has changed to the extent that it exceeds a predetermined ion-density alert threshold. This threshold will, in some embodiments, be selected to be at a level high enough to anticipate future dielectric breakdown in the insulative portion 113 of the boom should ion-density levels continue to rise. The threshold, in some embodiments, is set below an actual danger level such that an interested party will have time to take corrective action before actual dielectric breakdown in the area surrounding the insulating portion 113 occurs. In some embodiments, the computing system makes a further determination of the percentage the ion density is over the baseline. In yet other embodiments the threshold may be as a detected rate of change of the ion-density which has been pre-determined.

If the alert threshold in step 510 has not been exceeded, the process moves on to a step 512 where an indication is sent to one more of an operator, crew personnel (local or remote), ground crews, or other interested parties, to the effect that the ion density levels are no longer static. Additionally in step 512, the indication to the one or more of an operator, crew personnel (local or remote), ground crews, or other interested parties can include the percentage the ion density is over the baseline. FIG. 6A shows a video display shot of the boom 108 at an intermediate level of ion discharge which might trigger an indication. The indication can be transmitted as a message, color coded or flashing light (e.g., yellow), audio warning, or other communication transmitted to the interested party through the display on user interface 410. Alternatively, the indication can be made through other means. Regardless, the indication lets the interested party know that the ion-density levels are no longer static, so that the operator will pay special attention to his or her surroundings. After the warning is sent, the process goes back to start at step 504.

If the alert threshold in step 510 has been exceeded, the process moves on to a step 514 where an alert is communicated to one more of an operator, crew personnel (local or remote), ground crews, or other interested parties. The alert is an indication that a present danger exists because the dielectric properties of the insulative portion 113 have been compromised due to the dielectric breakdown of the environment surrounding the insulative portion 113. There can be a message, color coded display (e.g., red), or flashing light, audio warning, or other communication transmitted to the operator through the display on user interface 410 or elsewhere. FIG. 6B shows how the boom 108 in an elevated state of ion discharge might appear to the operator on the display. The alert informs the operator that immediate corrective action needs to be taken. In some embodiments, computer system 402, upon recognizing alert status, takes automated corrective action of some sort, such as removing the boom 108 from the high voltage source. After the alert is communicated, the process goes back to start at step 504 for continual monitoring so that once the boom 104 of the aerial device 100 is removed from the dangerous situation, the alert will be turned off.

In some embodiments, the ion-density readings taken will be continually saved onto the database 408 by the processor 406 such that the processor 406 can later retrieve past readings and present them to an operator or other user. This can prove valuable in instances where a dielectrically significant ion-density related event occurs so that it can be seen what lead up to the dielectric breakdown.

This historically recorded data might also prove valuable in configuring the processor to recognize trends in the UV photon readings obtained from the gradient control device 119. These recognized trends can be utilized by the processor in recognizing the need for and timing of the alerts.

In additional embodiments, the systems and methods described above can be used in conjunction with a conventional lower test electrode system to track and record ionic conditions as the lower test electrode system detects an increase of current leakage from the energized part, in order better understand the conditions in which leakage values increased or a flash-over event occurs. For example, the lower test electrode system could be used in cooperation with the system of FIG. 4 in making the assessments made in steps 502, 506, and 510 in FIG. 5 order to improve accuracy of the readings. Further, a lower test electrode system could be used in cooperation with the system of FIG. 4 to make trending assessments in the last paragraph.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

The invention claimed is:

1. An aerial device, comprising:
   a boom configured to be attached to a base and support a platform in a plurality of positions, said boom comprising a conductive portion and an insulative portion;
   an ion-density detection device positioned to measure ion density at a location surrounding the insulative portion of the boom; and
   a computing system operatively connected to the ion-density detection device, the computing system configured to receive data from the ion-density detection device and transmit an alert indicating a detected ion-density level indicative of a breakdown in dielectric integrity of the insulative portion of the boom.

2. The aerial device of claim 1, wherein the ion-density detection device is an ultraviolet (UV) sensor.

3. The aerial device of claim 1, wherein the ion-density detection device is an ultraviolet (UV) camera.

4. The aerial device of claim 3 comprising:
   at least one additional ion-density detection device, the at least one additional ion-density detection device being positioned to measure ion density at the location from a different vantagepoint.

5. The aerial device of claim 1, wherein the computing system is configured to couple the alert with a display, thereby enabling an interested party to view a location on the insulative portion of the boom.

6. The aerial device of claim 1, further comprising:
   a metal conductor mounted around a periphery of the insulative portion is configured to control and reduce ions into a viewing area established for the ion-density detection device.

7. The aerial device of claim 1 comprising:
   an upper boom defining both the conductive portion and the insulative portion, the ion-density detection device being mounted onto the conductive portion and being aimed toward a distal end of the insulative portion.

8. The aerial device of claim 1, wherein the computing system comprises:
   a processor;
   a database component operatively connected to the processor; and
   an alert device, the alert device being configured to transmit the alert using one of: an audio indication, a warning light, or a display.

9. The aerial device of claim 8, wherein the processor is configured to determine whether ion-density values are static relative to a baseline, and if not the processor is further configured to indicate to an operator that the ion-density values are not static.

10. The aerial device of claim 9, wherein the processor is configured to calculate an amount of ion density over the baseline and then display the amount to one or more of an operator, crew member, ground crew member, or remote party.

11. The aerial device of claim 8, wherein the processor is configured to determine whether ion-density values are above a threshold, and if so, transmit the alert.

12. The aerial device of claim 8 wherein the processor is configured to:
   use an ion-density reading to calculate an extent of ion-density existing above a baseline, and communicate the extent to one or more of an operator, crew member, ground crew member, or remote party;

the processor further configured to determine whether the ion-density reading is above a predetermined threshold, and then issue the alert if the ion-density reading is above the predetermined threshold.

13. The aerial device of claim 8, wherein the processor determines ion-density at the location on the insulative portion of the boom using one of a blob detection process or a particle analysis process.

14. The aerial device of claim 8 wherein the processor additionally receives information from a lower-test electrode system to identify the ion-density level indicative of the breakdown in dielectric integrity.

15. A system for determining a dielectric status of an environment surrounding an insulative component on an aerial device, the system comprising:

a computing system operatively connected to an ultraviolet (UV) camera, the UV camera being directed to view an area on or about the insulative component;

the computing system configured to evaluate images from a UV camera blob detection or particle analysis to determine whether an ion-density condition exists that is indicative of a dielectric breakdown surrounding the insulative component; and the computing system additionally being configured to transmit a warning signal, the warning signal indicating an existence of the ion-density condition surrounding the insulative component.

16. The system of claim 15 further comprising a processor, wherein:

the processor is configured to calculate an amount of ion density over baseline and then display the amount to the operator.

17. The system of claim 15 further comprising a processor, wherein:

the processor is configured to determine whether ion-density values are above a threshold, and if so, transmit the warning signal.

18. The system of claim 17 wherein:

the processor is further configured to, upon receiving the warning signal, activate one of an audio device, a light, or a display in a manner that conveys an alert indicating a dielectric breakdown to an operator and ground crew.

19. The system of claim 15 wherein:

the insulative component is a portion of a boom of the aerial device, and the UV camera is configured to view UV photon emissions from a gradient control device on the insulative component.

20. A dielectric component integrity monitoring system comprising:

a processor;

an ultraviolet (UV) detecting device operatively connected to the processor, the UV detecting device being aimed at an area on an insulative component where ion-density is a concern;

a database including one or more non-transitory computer readable storage media and having a computer program stored thereon for alerting one or more users of an aerial device, wherein the computer program instructs the processor to perform actions comprising:

receiving UV photon readings from the UV detecting device;

monitoring an ion-density value at the area on the insulative component using the UV detecting device;

determining if using the ion-density values indicate a risk of dielectric breakdown in a surrounding environment of the insulative component; and transmitting an alert to a user if the ion-density values are determined to indicate a risk of dielectric breakdown.

* * * * *